US009589673B1

United States Patent
Zhang et al.

(10) Patent No.: US 9,589,673 B1
(45) Date of Patent: Mar. 7, 2017

(54) ESTIMATION OF AN OPTIMAL READ THRESHOLD USING SYMMETRY

(71) Applicant: SK Hynix Inc., Gyeonggi-do (KR)

(72) Inventors: Fan Zhang, Fremont, CA (US); Frederick K. H. Lee, Mountain View, CA (US)

(73) Assignee: SK Hynix Inc., Gyeonggi-do (KR)

( * ) Notice: Subject to any disclaimer, the term of this patent is extended or adjusted under 35 U.S.C. 154(b) by 123 days.

(21) Appl. No.: 14/607,890

(22) Filed: Jan. 28, 2015

Related U.S. Application Data

(60) Provisional application No. 61/968,193, filed on Mar. 20, 2014.

(51) Int. Cl.
    *G11C 29/00* (2006.01)
    *G11C 29/50* (2006.01)
    *G06F 11/10* (2006.01)

(52) U.S. Cl.
    CPC .... *G11C 29/50004* (2013.01); *G06F 11/1072* (2013.01); *G11C 2029/5004* (2013.01)

(58) Field of Classification Search
    CPC ......... G11C 16/20; G11C 16/26; G11C 16/08; G11C 11/5642; G11C 16/10; G11C 16/349; G11C 29/021; G11C 29/028; G11C 29/50004; G06F 11/1072
    See application file for complete search history.

(56) References Cited

U.S. PATENT DOCUMENTS

| | | | |
|---|---|---|---|
| 7,975,192 B2 | 7/2011 | Sommer et al. | |
| 8,000,135 B1* | 8/2011 | Perlmutter | G11C 11/5642 365/185.03 |
| 8,482,978 B1* | 7/2013 | Perlmutter | G11C 11/5642 365/185.03 |
| 8,531,888 B2* | 9/2013 | Chilappagari | G11C 16/26 365/185.03 |
| 9,159,407 B2* | 10/2015 | Ish-Shalom | G11C 11/5642 |
| 9,230,639 B2* | 1/2016 | Ish-Shalom | G11C 16/20 |
| 2010/0296350 A1* | 11/2010 | Kim | G11C 11/5642 365/189.15 |
| 2012/0221772 A1* | 8/2012 | Seol | G06F 13/1668 711/103 |
| 2013/0176775 A1* | 7/2013 | Tang | G11C 16/26 365/185.2 |
| 2014/0112077 A1* | 4/2014 | Ish-Shalom | G11C 16/20 365/185.18 |

* cited by examiner

*Primary Examiner* — Guerrier Merant
(74) *Attorney, Agent, or Firm* — I P & T Group LLP

(57) ABSTRACT

A group of cells in solid state storage is sampled in order to obtain a sampled distribution associated with the group of cells. An axis of symmetry is determined using the sampled distribution. At least some portion of a conditional distribution is determined based at least in part on: (1) the sampled distribution and (2) the axis of symmetry. An optimal read threshold is estimated using the sampled distribution and the conditional distribution.

17 Claims, 13 Drawing Sheets

ESTIMATION OF AN OPTIMAL READ THRESHOLD USING SYMMETRY

CROSS REFERENCE TO OTHER APPLICATIONS

This application claims priority to U.S. Provisional Patent Application No. 61/968,193 entitled ENHANCEMENT OF READ REFERENCE CALIBRATION filed Mar. 20, 2014 which is incorporated herein by reference for all purposes.

BACKGROUND OF THE INVENTION

Many techniques for estimating an optimal read threshold for solid state storage do so by finding a minimum from multiple (test) reads. Such techniques assume that the minimum is close to the optimal read threshold and therefore the minimum is a good approximation of the optimal read threshold. There are at least two issues associated with such techniques. First, the assumption that the optimal read threshold is close to the minimum falls apart if one or more of the underlying conditional distribution functions is not symmetric (e.g., the conditional distribution for cells that are actually storing a 1 or a 0 is not symmetric about some vertical line). In real-world solid state storage systems this can occur, especially as the storage get older and the electrical insulation starts to break down with repeated programs and erases. Second, in some cases there is no minimum that is a plausible optimal read threshold (e.g., the only minima are located at the lowest and highest voltage being tested, which is not a plausible location for the optimal read threshold). New optimal read threshold estimation techniques which overcome these problems would be desirable.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
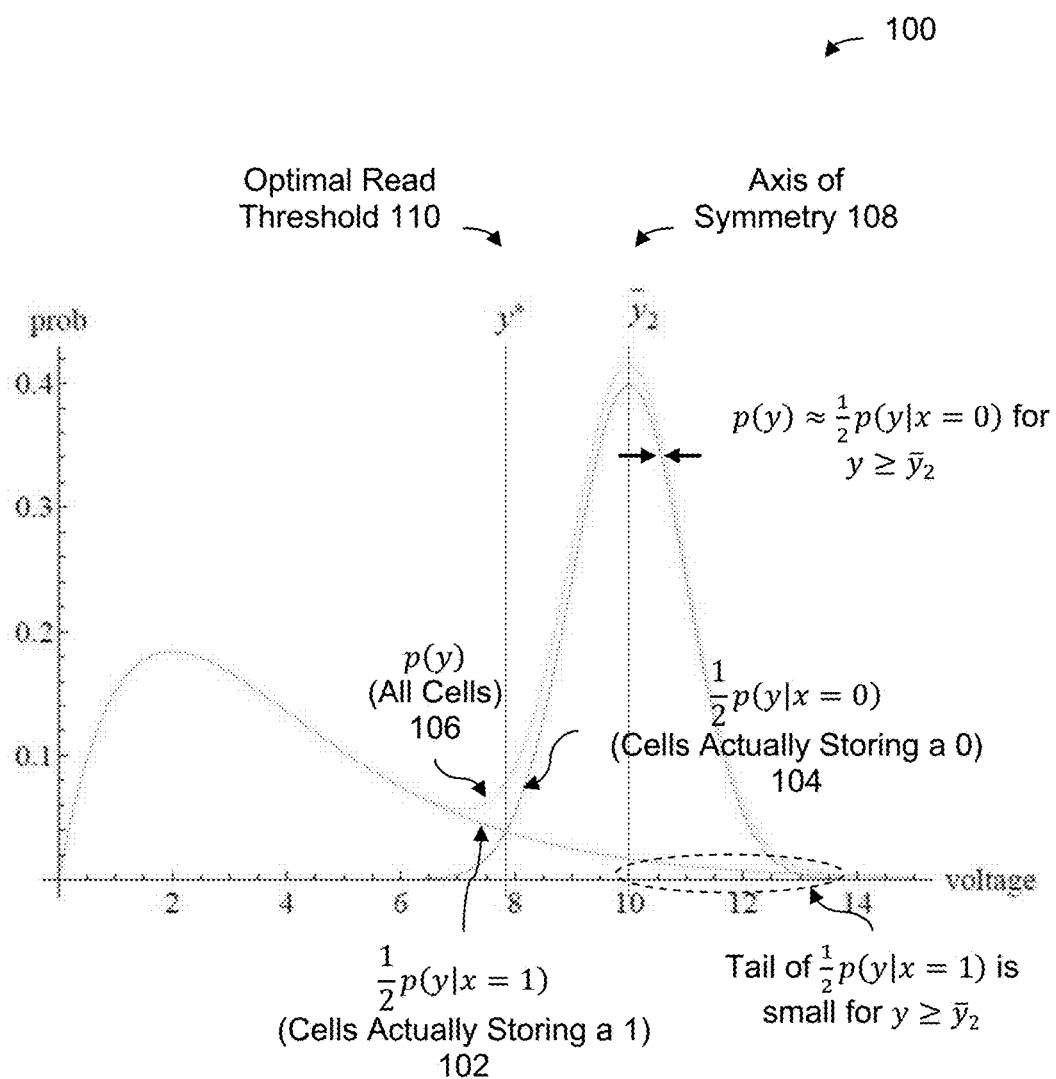
FIG. 1 is a diagram illustrating an embodiment of distributions associated with a single-level cell (SLC) solid state storage system.

FIG. 1 is a diagram illustrating an embodiment of distributions associated with a single-level cell (SLC) solid state storage system. In SLC storage, each cell is configured to a store a single bit (e.g., a 0 or a 1). Diagram 100 shows a variety of distribution functions. In this particular example, the distribution functions are probability distribution functions where the x-axis shows voltage and the y-axis shows the probability of that particular voltage being stored by a cell.

Let y (not to be confused with the y-axis of diagram 100) be the voltage stored by a cell and let x (not to be confused with the x-axis of diagram 100) be the stored bit (e.g., x=0 or 1 in the case of SLC). Function 106 shows the overall probability distribution function (i.e., p(y)). For a given voltage, p(y) outputs the probability that a cell is storing that particular voltage.

Overall probability distribution function 106 may be broken down into two conditional probability distribution functions: the conditional probability distribution function for those cells that are (actually) storing a 1 (i.e., p(y|x=1)) and the conditional probability distribution function for those cells that are (actually) storing a 0 (i.e., p(y|x=0)). The former only considers cells that are storing a 1 and ignores cells that are storing a 0; the latter only considers cells that are storing a 0 and ignores cells that are storing a 1. For a given voltage, p(y|x=1) outputs the probability that a cell (that is storing a 1) has that particular voltage. Similarly, conditional probability distribution function p(y|x=0) takes as its input a given voltage and outputs a probability that a cell (that is storing a 0) has that particular voltage.

It is noted that the actual stored bits are not known (or else the need to estimate the optimal read threshold (i.e., y*) in order to perform a better read would be obviated) and thus functions 102 and 104 are shown in this figure and other figures merely to describe the technique.

Each of the probability distribution functions described above sums to 1 when integrated (i.e., ∫p(y)dy=1, ∫p(y|x=1) dy=1, and ∫p(y|x=0)dy=1) and so the conditional probability distribution functions must be scaled appropriately before being summed to generate the overall probability distribution function. That is:

$$p(y)=p(x=1)p(y|x=1)+p(x=0)p(y|x=0). \quad (1)$$

In this particular example, exactly half of the bits stored are 0s and the other half are 1s, so p(x=1)=p(x=0)=½. Diagram 100 shows the conditional probability distribution functions scaled accordingly, and as such function 102 is ½p(y|x=1) and function 104 is ½p(y|x=0). Function 106 is thus the sum of functions 102 and 104 (i.e., p(y)=½p (y|x=1)+½p(y|x=0)).

As is shown in diagram 100, function 104 (i.e., ½p (y|x=0)) is very similar in value to function 106 (i.e., p(y)) for the voltage range y≥$\bar{y}_2$. This is because the tail of function 102 is very close to 0 in that range. In Equation (1), this causes the left-hand term (i.e., ½p(y|x=1)) to be close to 0 for y≥$\bar{y}_2$ and so p(y)≈½p(y|x=0) for y≥$\bar{y}_2$.

Another observation is that function 104 (i.e., ½p(y|x=1)) is fairly symmetric about axis of symmetry 108 (i.e., when the voltage is $\bar{y}_2$).

Using these two observations, optimal read threshold 110 may be estimated without having to find a minimum. The following figure shows an example of this more clearly.

Figure 2:
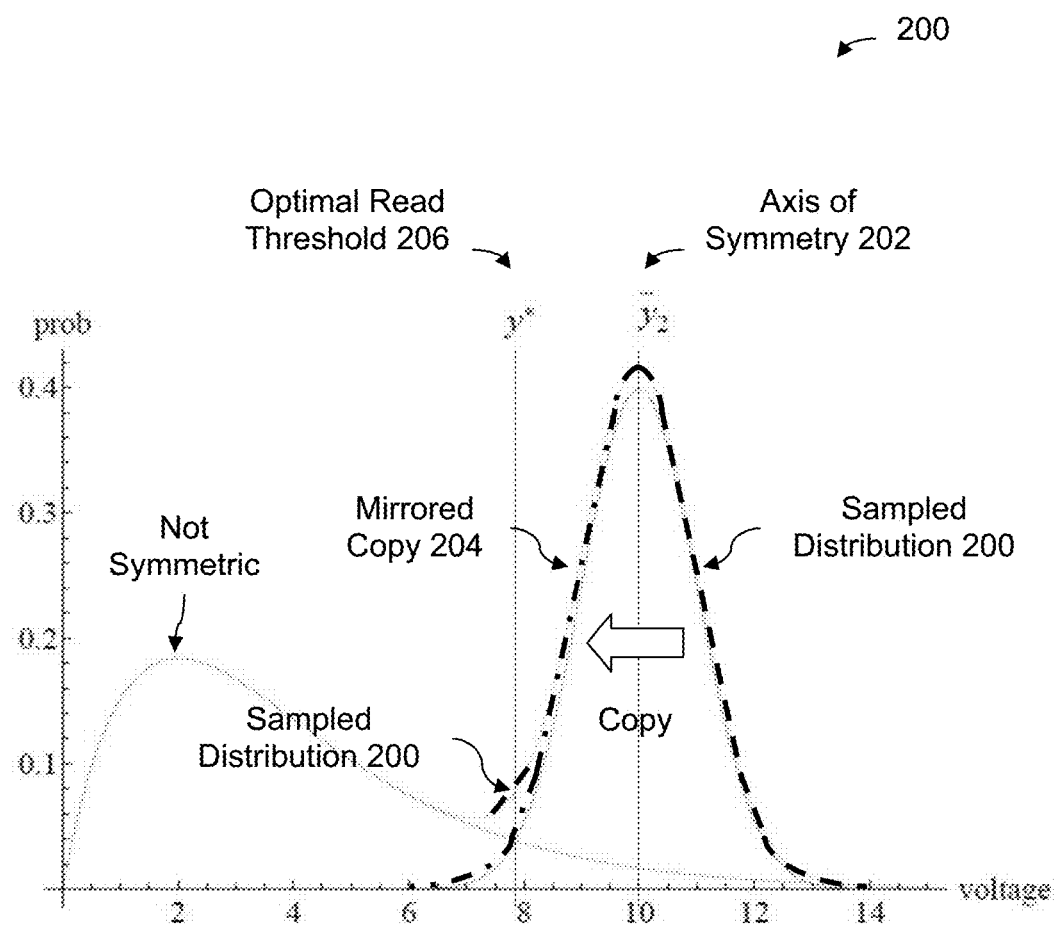
FIG. 2 is a diagram illustrating an embodiment of a mirrored copy which is obtained from a sampled distribution.

FIG. 2 is a diagram illustrating an embodiment of a mirrored copy which is obtained from a sampled distribution. In the example shown, sampled distribution 200 (shown with a dashed line) is obtained by sampling the solid state storage. For example, the solid state storage is read multiple times at different read threshold values, including (but not limited to) the voltage range [10, 14]. Sampled distribution 200 corresponds to overall probability distribution function p(y) 100 in FIG. 1 (e.g., sampled distribution 200 and overall probability distribution function 100 have the same shape).

Next, axis of symmetry 202 is found using sampled distribution 200. For example, the voltage at which sampled distribution 200 has a maximum may be found.

Once axis of symmetry 202 found, sampled distribution 200 can be flipped and copied about axis of symmetry 202 to obtain mirrored copy 204 (shown with a dashed-and-dotted line). Mirrored copy 204 corresponds to ½p(y|x=0) (104) shown in FIG. 1 (e.g., mirrored copy 204 and function 104 have the same shape). For readability, the dashed line and dashed-and-dotted line are not permitted to overlap in diagram 200, even though their corresponding functions may overlap over some voltage ranges.

Near optimal read threshold 206, mirrored copy 204 and sampled distribution 200 diverge. Using mirrored copy 204 and sampled distribution 200, optimal read threshold 206 may be found. In some embodiments, mirrored copy 204 is subtracted from sampled distribution 200 to obtain the other (weighted) conditional distribution function. That is, ½p (y|x=1) may be found by subtracting ½p(y|x=0) (e.g., represented by mirrored copy 204) from p(y) (e.g., represented by sampled distribution 200). The two (weighted) conditional distribution functions may then be set equal to each other and the voltage at which they intersect may be solved for.

In some embodiments, because the conditional probability distribution functions (scaled appropriately) are equal to each other at their intersection point, the voltage at which sampled distribution 200 is two times the value of mirrored copy 204 may be found in order to find optimal read threshold 206. More formally, when the number of stored 0s and 1s is equal:

$$p(y)=\tfrac{1}{2}p(y|x=1)+\tfrac{1}{2}p(y|x=0); \text{ and} \quad (2)$$

and $$\tfrac{1}{2}p(y|x=1)=\tfrac{1}{2}p(y|x=0) \text{ at } y^*, \text{ so} \quad (3)$$

$$p(y)=\tfrac{1}{2}p(y|x=0)+\tfrac{1}{2}p(y|x=0) \text{ at } y^*, \text{ and thus} \quad (4)$$

$$p(y)=2(\tfrac{1}{2}p(y|x=0)) \text{ at } y^* \quad (5)$$

The term on the left side of Equation (5) corresponds to sampled distribution 200 and the inner term on the right side of Equation 5 corresponds to mirrored copy 204. Thus, at optimal read threshold 206, sampled distribution 200 is twice the value of mirrored copy 204 and the voltage at which this relationship is true (or an approximation thereof) may be found in order to find optimal read threshold 206. This approach may be preferred in some embodiments because it is faster and/or requires less processing.

It is noted that this optimal read threshold estimation technique does not work if the lower conditional distribution is used to generate the mirrored copy because that conditional distribution is not symmetric (see diagram 200). Thus, although the left-hand side of that lower conditional distribution can be approximated quite well using a sampled distribution, copying the left-hand side of the lower conditional distribution to create a mirrored copy would not be an accurate reflection of the actual distribution. In general (as will be described in more detail below), the conditional distribution corresponding to the lowest voltage range tends to lose symmetry over time, whereas the other conditional distributions corresponding to higher voltage ranges tend to maintain their symmetry (e.g., even as the solid state storage becomes worn with increasing program/erase count). To put it another way, if the bit mapping shown in FIG. 1 were swapped (i.e., function 102 corresponded to ½p(y|x=0) instead of ½p(y|x=1) and function 104 corresponded to ½p(y|x=1) instead of ½p(y|x=0)), then the rightmost conditional distribution (in this case, ½p(y|x=1)) would still be sufficiently symmetric even with the swapped bit mapping.

The following figures describe various embodiments of this technique in more detail. First, a process is formally described. Then, more detailed embodiments of some of the steps are described.

Figure 3:
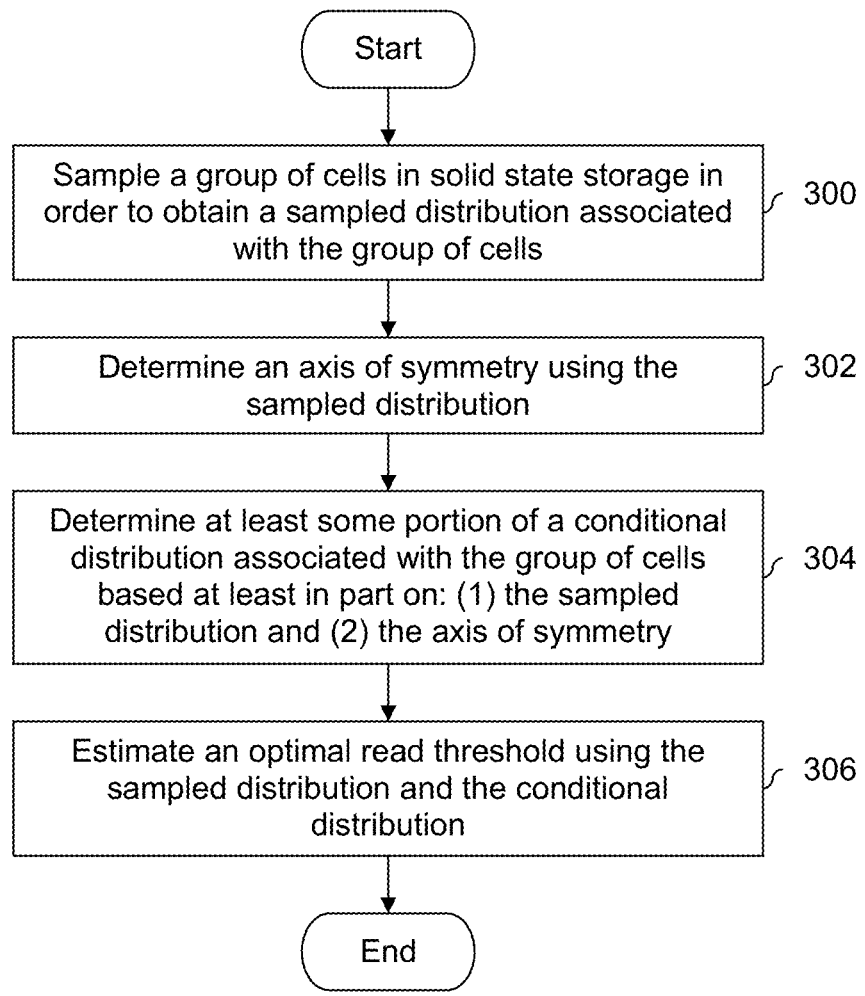
FIG. 3 is a flowchart illustrating an embodiment of an optimal read threshold estimation process which takes advantage of symmetry.

FIG. 3 is a flowchart illustrating an embodiment of an optimal read threshold estimation process which takes advantage of symmetry. In some embodiments, the process shown is performed by a storage controller which is implemented on a semiconductor device, such as an application-specific integrated circuit (ASIC) or a field-programmable gate array (FPGA). In some embodiments, this process is triggered when a default read threshold returns too many bit errors (e.g., when the read-back data contains more bit errors than can be corrected by an error correction decoder). In some embodiments, some other optimal read threshold estimation technique is performed before this technique is attempted. For example, some other techniques may be faster (but not as accurate) and so those estimation techniques may be attempted first.

At 300, a group of cells in solid state storage is sampled in order to obtain a sampled distribution associated with the group of cells. See, for example, FIG. 2 where sampled distribution 200 shows one example of a sampled distribution.

At 302, an axis of symmetry is determined using the sampled distribution. In FIG. 2, for example, axis of symmetry 202 shows one example.

At 304, at least some portion of a conditional distribution associated with the group of cells is determined based at least in part on: (1) the sampled distribution and (2) the axis of symmetry. See, for example, FIG. 2 where the right side of sampled distribution 200 is copied about axis of symmetry 202 in order to generate mirrored copy 204 (which is the left side of a conditional distribution).

At 306, an optimal read threshold is estimated using the sampled distribution and the conditional distribution In some embodiments, the other conditional distribution is first found (e.g., ½p(y|x=1) is found from ½p(y|x=0) and p(y)) and then the two conditional distributions are used to find the optimal read threshold. In some embodiments, the optimal read threshold is found directly from ½p(y|x=0) and p(y) without first finding ½p(y|x=1).

Note that although some of the examples described herein show continuous functions, the conditional distribution and/ or the sampled distribution described in FIG. 3 may be a discrete function(s). Similarly, although some of the examples described herein describe probability distribution functions (i.e., that output probabilities as opposed to counts or numbers of things), in some embodiments the conditional distribution and/or the sampled distribution described in FIG. 3 are histograms that output (as an example) numbers or counts of cells as opposed to probabilities. The shape of a probability distribution function matches the shape of a corresponding histogram and so the technique holds even though the samples and/or distributions relate to counts or numbers of things.

One benefit to the technique described above is that it does not rely upon finding a minimum. Using a minimum to estimate an optimal read threshold has a number of drawbacks. First, in some cases a minimum cannot be found or the minimum is not a plausible voltage (e.g., because it is the lowest or highest voltage in the range, and the optimal read threshold is expected to be somewhere in the middle). Second, even if the minimum can be found, it may be a poor estimate of the optimal read threshold. In FIG. 1, for example, the minimum is close to a voltage of 7, but the voltage at which the two conditional distributions cross is closer to a voltage of 8.

Figure 4:
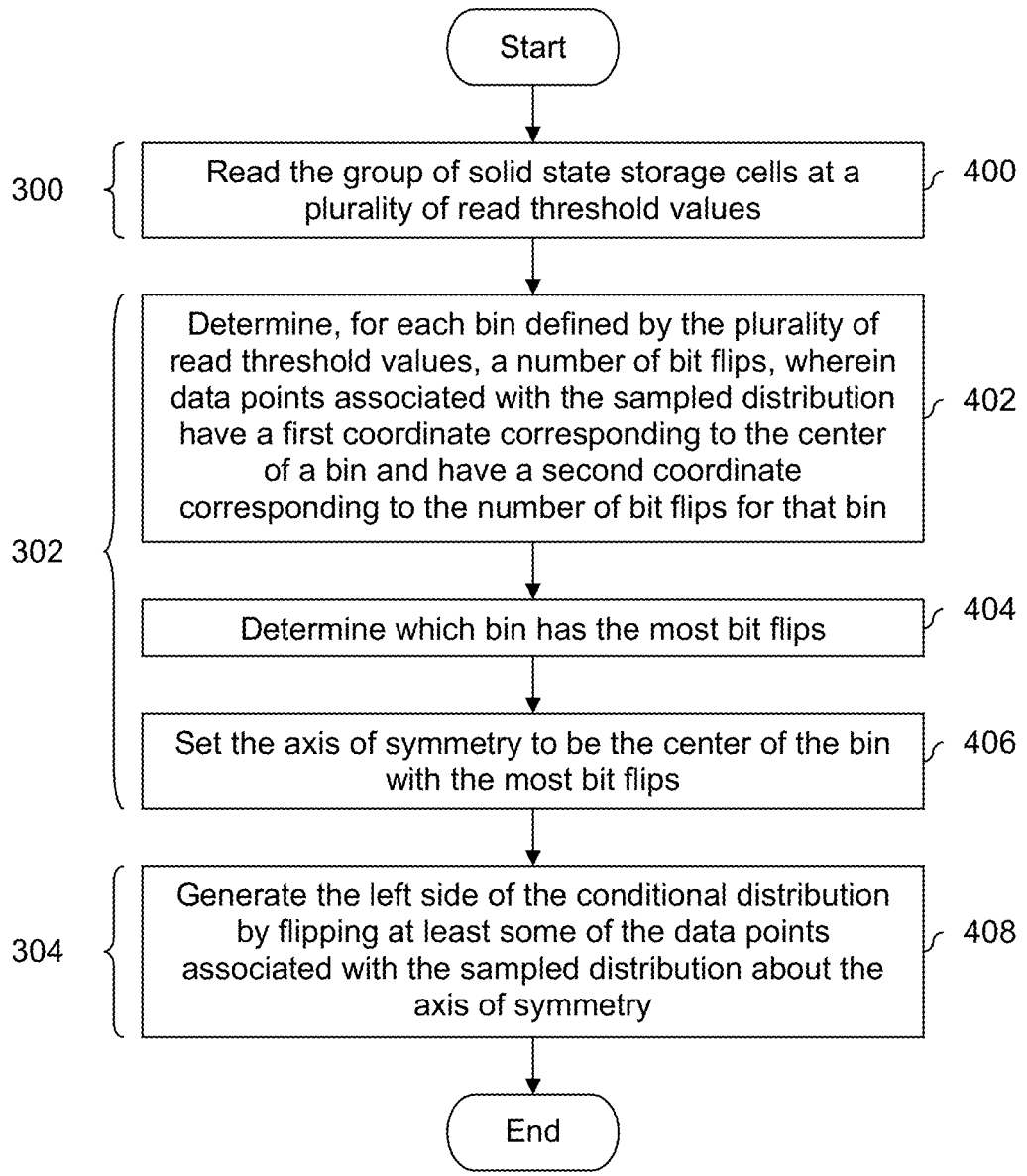
FIG. 4 is a flowchart illustrating an embodiment of a more detailed process for determining at least some portion of a conditional distribution.

FIG. 4 is a flowchart illustrating an embodiment of a more detailed process for determining at least some portion of a conditional distribution. In some embodiments, various portions of the process of FIG. 4 is/are used in step 300, 302, and/or 304 of FIG. 3.

At 400, the group of solid state storage cells is read at a plurality of read threshold values, wherein a count of cells having a specified read-back value is obtained with each read. For example, if the specified read-back value is a 0, then the number of cells with a 0 is counted. In systems where there are two or more bits per cell (e.g., multi-level cell (MLC) storage has 2 bits per cell and tri-level cell (TLC) storage has 3 bits per cell), the count may relate to any bit position (e.g., most significant bit (MSB), least significant bit (LSB), etc.).

At 402, for each bin defined by the plurality of read threshold values, a number of bit flips is determined using the counts of cells, wherein data points associated with the sampled distribution have a first coordinate corresponding to the center of a bin and have a second coordinate corresponding to the number of bit flips for that bin. The following figure shows an example of this.

Figure 5:
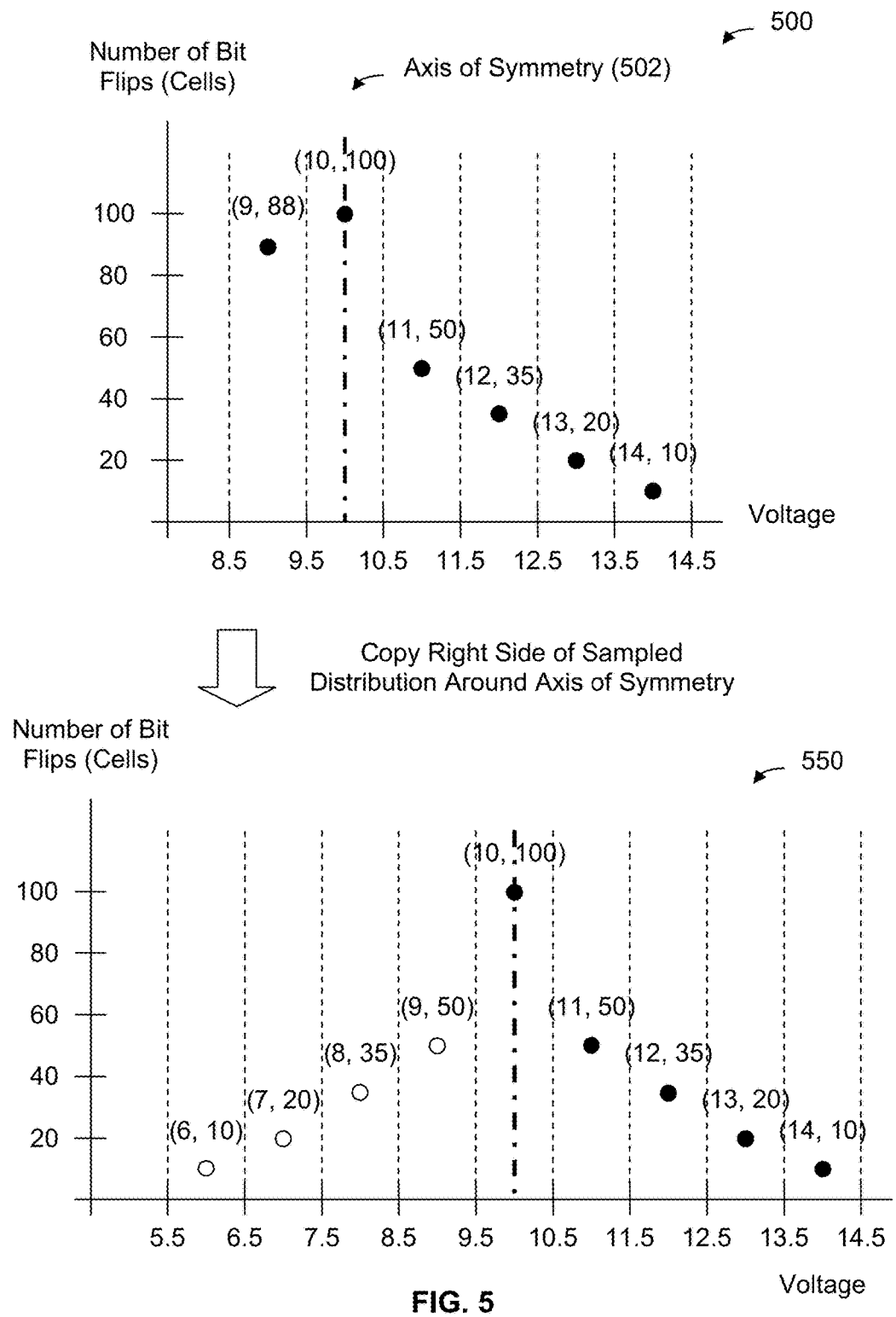
FIG. 5 is a diagram illustrating an embodiment of bins defined by a plurality of read threshold values.

FIG. 5 is a diagram illustrating an embodiment of bins defined by a plurality of read threshold values. In diagram 500, reads have been performed at read threshold values of 8.5, 9.5, 10.5, 11.5, 12.5, 13.5, and 14.5 (not necessarily in that order), which produces 6 bins having centers at voltages of 9, 10, 11, 12, 13, and 14.

In one example, the number of bit flips for each bin is determined by subtracting the number of cells having a specified read-back value (e.g., a 0 or a 1) at one read threshold value from the number of cells having the same specified read-back value at an adjacent read threshold value (and taking the absolute value, if needed). For example, in diagram 500, the number of cells having a read-back value of 1 (or 0) at a read threshold value of 14.5 may be subtracted from the number of cells having the same read-back value at a read threshold value of 14.5. In this SLC storage example, a cell is read as a 1 if the cell is storing a voltage less than the read threshold value and is read as a 0 if the stored voltage is greater than the read threshold value, so the number of 1s read at 14.5 is guaranteed to be greater than or equal to the number of 1s read at 13.5, and so an absolute value is not required in this example. Diagram 500 shows the example number of bit flips for each of the bins.

The number of bit flips for each bin corresponds to the number of cells which have a voltage in that range. Consider this example: the number of cells having a read-back value of 1 at a read threshold value of 14.5 corresponds to the number of cells which are storing a voltage less than 14.5. Similarly, the number of cells having a read-back value of 1 at a read threshold value of 13.5 corresponds to the number of cells which are storing a voltage less than 13.5. As such, the number of cells having a voltage between 13.5 and 14.5 equals the number of bit flips for that same range. In various embodiments, a flip from 0 to 1 or a flip to 1 to 0 may be counted. The number of cells having a read-back value of 1 at a read threshold value of 14.5 is guaranteed to be greater than or equal to the number of cells having a read-back value of 1 at a read threshold value of 13.5, so in this particular example an absolute value is not needed.

The data points shown in diagram 500 thus show an example of data points associated with a sampled distribution referred to in step 402 of FIG. 4.

Returning to FIG. 4, it is determined which bin has the most bit flips at step 404. In FIG. 5, this would be the bin having a range of 9.5 to 10.5.

At 406, the axis of symmetry is set to be the center of the bin with the most bit flips. In FIG. 5, for example, axis of symmetry 502 is set to a voltage of 10, which the center of the bin with the most bit flips.

At 408, the left side of the conditional distribution is generated by flipping at least some of the data points associated with the sampled distribution about the axis of symmetry. Put another way, the right side of the sampled distribution is copied around the axis of symmetry. See, for example the transition from diagram 500 to diagram 550 in FIG. 5, where the data points (11, 50), (12, 35), (13, 20), and (14, 10) have been copied around axis of symmetry 502. Note that the data point (9, 88) in diagram 500 does not appear in diagram 550 in order to more clearly show the flipping. Diagram 550 shows one example of conditional distribution generated at step 304 in FIG. 3 and corresponds to function 104 in FIG. 1.

Figure 6:
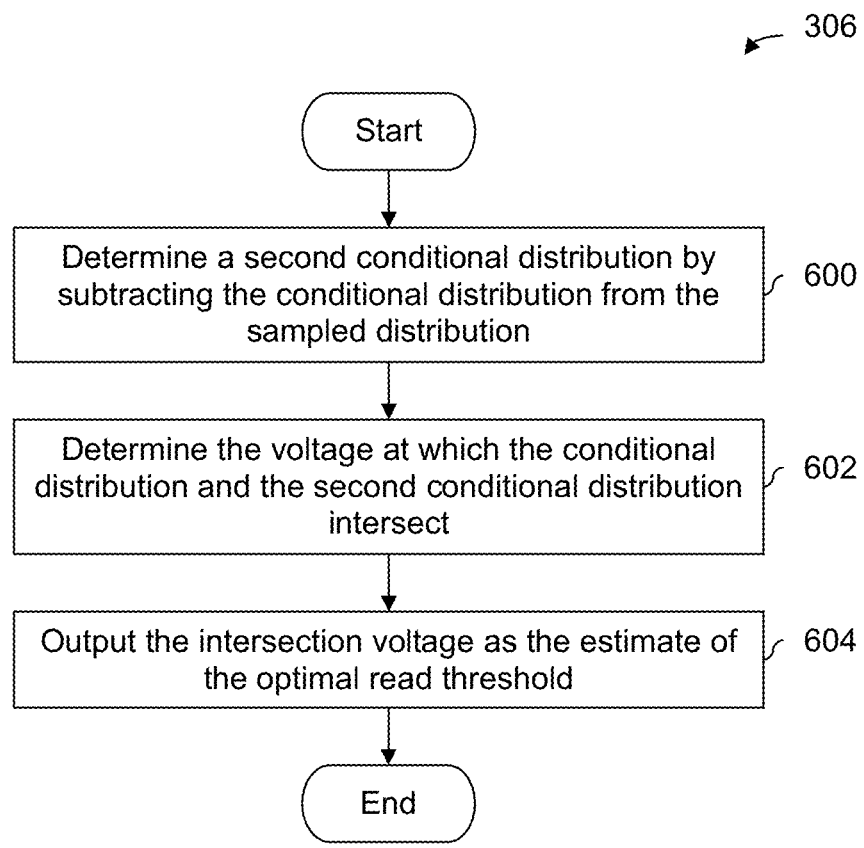
FIG. 6 is a flowchart illustrating an embodiment of a process for estimating an optimal read threshold using a sampled distribution and a conditional distribution, including by determining a second conditional distribution.

FIG. 6 is a flowchart illustrating an embodiment of a process for estimating an optimal read threshold using a sampled distribution and a conditional distribution, including by determining a second conditional distribution. In some embodiments, the process is used at step 306 in FIG. 3.

At 600, a second conditional distribution is determined by subtracting the conditional distribution from the sampled distribution.

At 602, the voltage at which the conditional distribution and the second conditional distribution intersect is determined. For example, linear estimation may be used to obtain a line for the (first) conditional distribution and the second conditional distribution. The voltage at which the two interpolated lines intersect may be found.

At 604, the intersection voltage is output as the estimate of the optimal read threshold.

Figure 7:
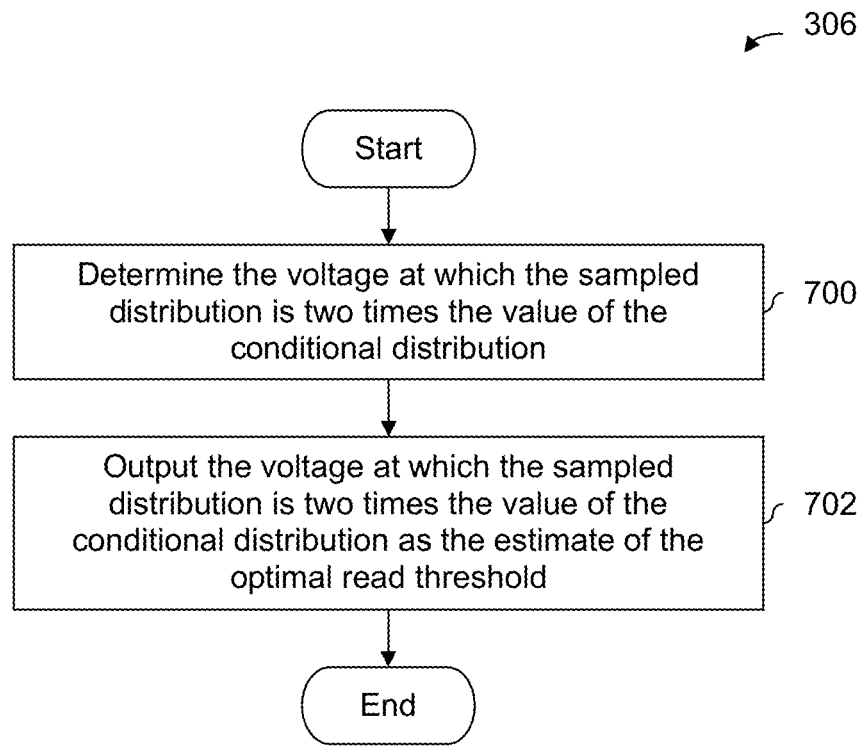
FIG. 7 is a flowchart illustrating an embodiment of a process for estimating an optimal read threshold using a sampled distribution and a conditional distribution, without determining a second conditional distribution.

FIG. 7 is a flowchart illustrating an embodiment of a process for estimating an optimal read threshold using a sampled distribution and a conditional distribution, without determining a second conditional distribution. In some embodiments, the process is used at step 306 in FIG. 3. In some embodiments, the process of FIG. 7 is preferable to that shown in FIG. 6 because this process is faster.

At 700, the voltage at which the sampled distribution is two times the value of the conditional distribution is determined. At 702, the voltage at which the sampled distribution is two times the value of the conditional distribution is output as the estimate of the optimal read threshold.

In one example of this process, the number of bit flips in a set of data points associated with the conditional distribution are doubled. Then, for each bin, the doubled number of bit flips associated with the conditional distribution is compared against the number of bit flips from the sampled distribution to determine the bin at which they are equal or at least cross over (e.g., one goes from being less than the other to being greater than the other, or vice versa). The center of that bin is then output as the optimal read threshold.

In another example of this process, the number of bit flips in a set of data points associated with the conditional distribution are doubled. Linear interpolation is then performed on the (doubled) data points for the conditional distribution and on the data points for the sampled distribution in order to obtain two lines. The voltage at which the two linearly interpolated lines is then determined and output as the optimal read threshold.

Figure 8:
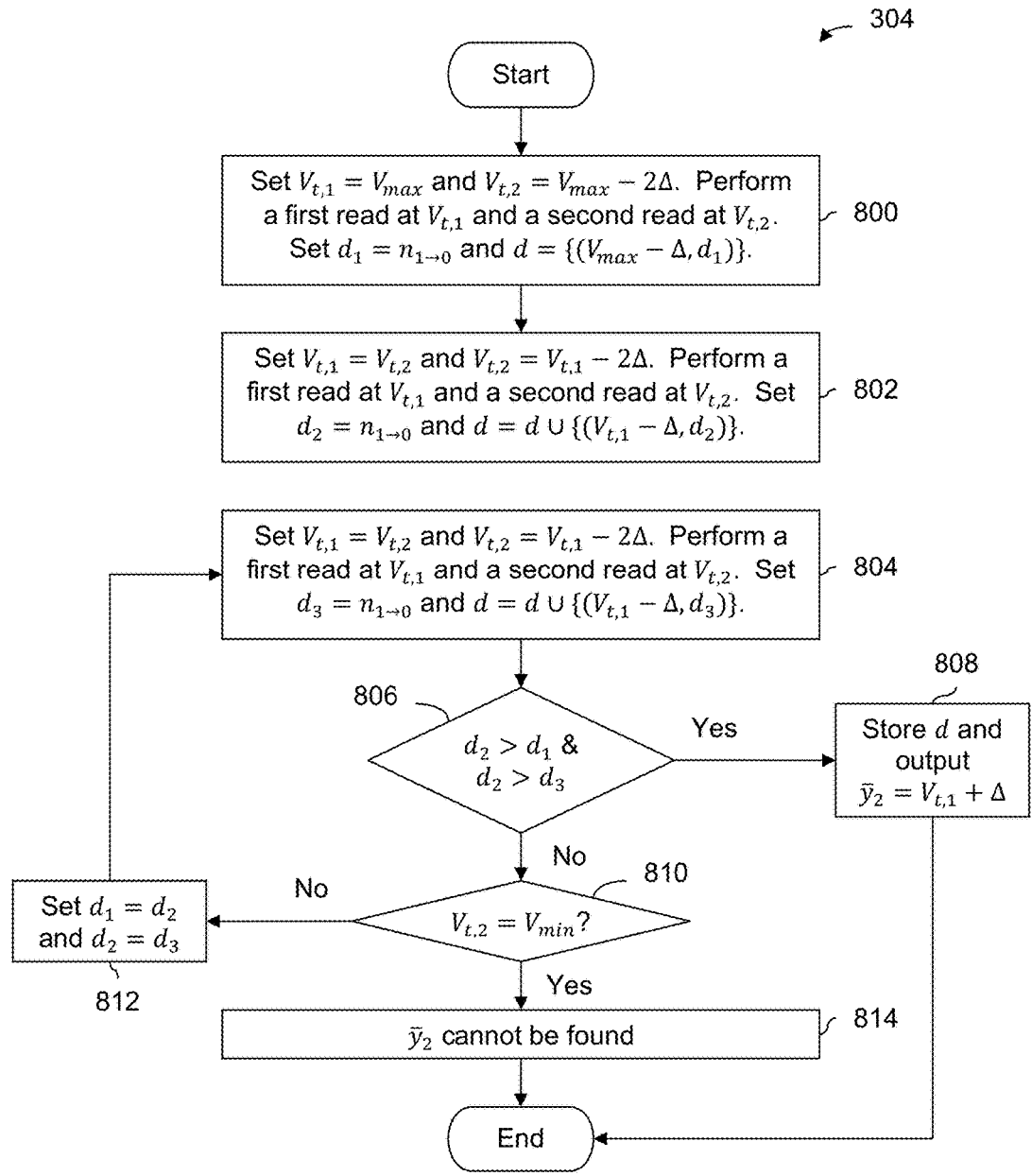
FIG. 8 is a flowchart illustrating a second embodiment of a process for generating at least some portion of a conditional distribution.

FIG. 8 is a flowchart illustrating a second embodiment of a process for generating at least some portion of a conditional distribution. In some embodiments, the process is used at step 304 in FIG. 3. In order to clearly describe the technique, duplicate reads may be described in the process below (e.g., in order to more clearly describe which read thresholds a particular bit flip count relates to). Naturally, in a real-world system, these duplicate reads maybe eliminated since reading the same group of solid state storage with the same read threshold will return the same results (assuming a relatively short amount of time has passed between the two reads at the same read threshold, and no program or erase was performed between the two reads).

At 800, $V_{t,1}$ is set to $V_{max}$ and $V_{t,2}$ is set to $V_{max}-2\Delta$. $V_{t,1}$ and $V_{t,2}$ are a first and second read threshold, respectively. $V_{max}$ is a maximum read threshold value and $\Delta$ is a (fixed) step size, typically a small one. A first read is performed at $V_{t,1}$ and a second read is performed at $V_{t,2}$. As described above, in one SLC example, if the stored voltage is less than the read threshold, then a 1 is read; if the stored voltage is greater than the read threshold, then a 0 is read. $d_1$ is set to $n_{1\to 0}$ and d is set to $\{(V_{max}-\Delta, d_1)\}$. $n_{1\to 0}$ is the number of bits that flipped from 1 to 0 when going from a read threshold of $V_{t,1}$ to a read threshold of $V_{t,2}$. d is a set of data points associated with a sampled distribution, and $d_1$ is a first number of bit flips from the set d which is considered by the process (e.g., to decide whether an axis of symmetry has been found). Using FIG. 5 as an example, the data points shown in diagram 500 show one example of a set of data points, d. In this example, $1\to 0$ bit flips are used because the reads go from right to left.

At 802, $V_{t,1}$ is set to $V_{t,2}$ and $V_{t,2}$ is set to $V_{t,1}-2\Delta$. In other words, the two read thresholds are shifted to the left (i.e., downward) by $2\Delta$. A first read is performed at $V_{t,1}$ and a second read is performed at $V_{t,2}$. $d_2$ is set to $n_{1\to 0}$ and d is set to $d\cup\{(V_{t,1}-\Delta, d_2)\}$. $d_2$ is a second number of bit flips from the set d.

At 804, $V_{t,1}$ is set to $V_{t,2}$ and $V_{t,2}$ is set to $V_{t,1}-2\Delta$. A first read is performed at $V_{t,1}$ and a second read is performed at $V_{t,2}$. $d_3$ is set to $n_{1\to 0}$ and $d=d\cup\{(V_{t,1}-\Delta, d_3)\}$. $d_3$ is a third number of bit flips from the set d.

In this example, it is assumed that $V_{max}$ is large enough and $\Delta$ is small enough so that steps 800, 802, and 804 can be performed at least once without $V_{t,2}$ encountering the limit of $V_{min}$. As such, there is no check when going from step 802 to 804 to ensure that $V_{t,2} \neq V_{min}$.

At 806, it is determined if $d_2 > d_1$ and $d_2 > d_3$. Put another way, step 806 checks to see if (when considering only the three most recently added data points), the second most recently added data point (i.e., corresponding to $d_2$) has the most bit flips. In diagram 500 in FIG. 5, this would occur when $d_1$, $d_2$, and $d_3$ are 50, 100, and 88, respectively.

If so, d is stored and $\bar{y}_2$ is output as $V_{t,1}+\Delta$ at 808. $\bar{y}_2$ is the axis of symmetry (see, e.g., axis of symmetry 502 in FIG. 5). If not, it is determined at 810 if $V_{t,2}=V_{min}$. $V_{min}$ is the minimum read threshold value and no more reads can be performed if $V_{t,2}=V_{min}$. If so, it is concluded at 814 that an axis of symmetry $\bar{y}_2$ cannot be found. If $V_{t,2} \neq V_{min}$, then $d_1$ is set to $d_2$ and $d_2$ is set to $d_3$ at 812 and step 804 is repeated.

The following table shows some example values for FIG. 8 when $\Delta=0.5$ and $V_{max}=14.5$.

TABLE 1

Example values for FIG. 8.

| $1^{st}$ Read Threshold ($V_{t,1}$) | $2^{nd}$ Read Threshold ($V_{t,2}$) | $d_1$ | $d_2$ | $d_3$ | $\bar{y}_2$ found? |
|---|---|---|---|---|---|
| 14.5 | 13.5 | 10 | — | — | No |
| 13.5 | 12.5 | 10 | 20 | — | No |
| 12.5 | 11.5 | 10 | 20 | 35 | No |
| 11.5 | 10.5 | 20 | 35 | 50 | No |
| 10.5 | 9.5 | 35 | 50 | 100 | No |
| 9.5 | 8.5 | 50 | 100 | 88 | Yes; $\bar{y}_2 = 10$ |

Figure 9:
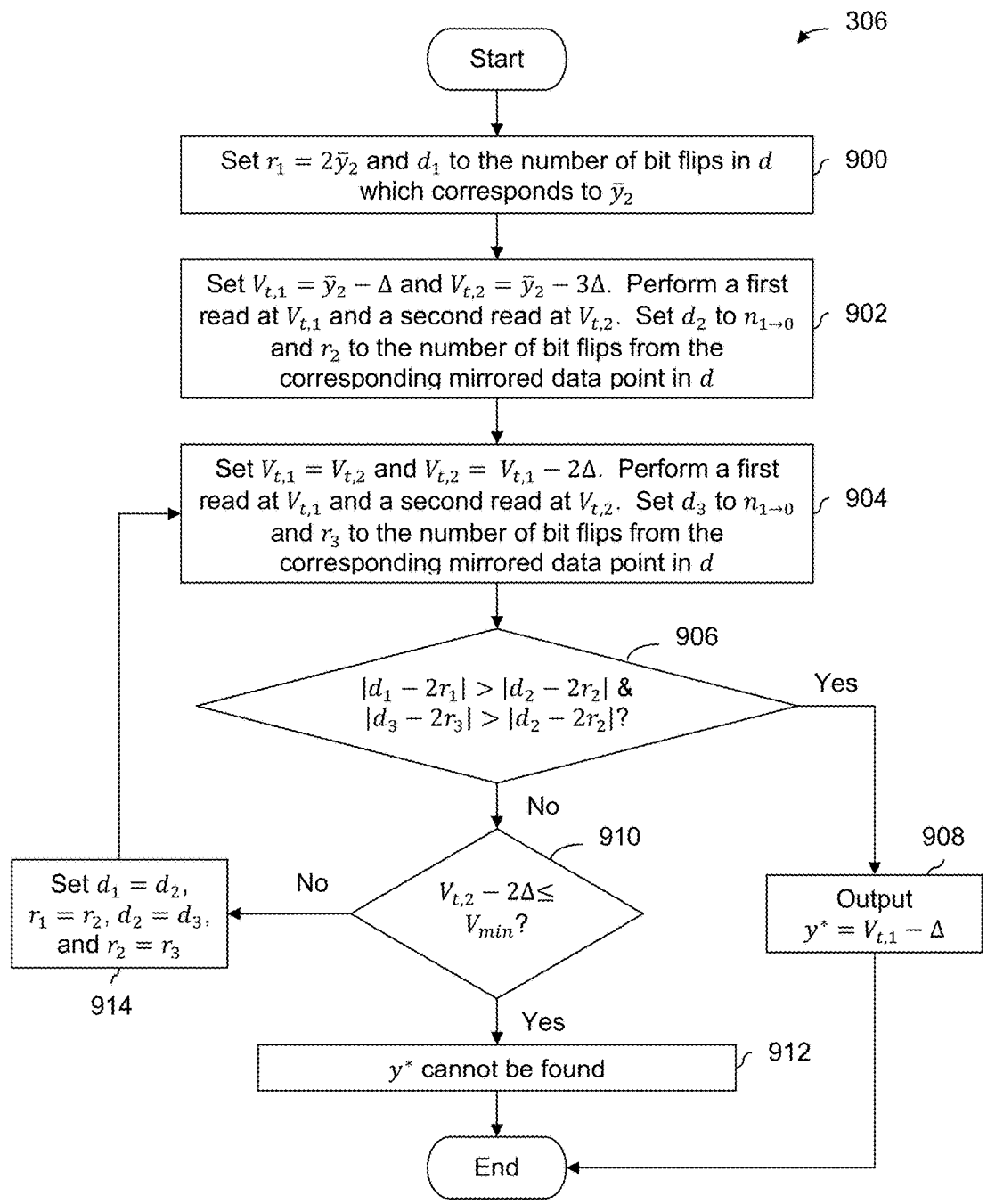
FIG. 9 is a flowchart illustrating a third embodiment of a process for estimating an optimal read threshold using a sampled distribution and a conditional distribution.

FIG. 9 is a flowchart illustrating a third embodiment of a process for estimating an optimal read threshold using a sampled distribution and a conditional distribution. In some embodiments, the process is used at step 306 in FIG. 3. As before, some duplicate reads may be described herein in order to clearly describe the technique; some or all of duplicate reads may be eliminated in real-world systems.

At 900, $r_1$ is set to $2\bar{y}_2$ and $d_1$ is set to the number of bit flips in d which corresponds to $\bar{y}_2$.

At 902, $V_{t,1}$ is set to $\bar{y}_2-\Delta$ and $V_{t,2}$ is set to $\bar{y}_2-3\Delta$. A first read is performed at $V_{t,1}$ and a second read is performed at $V_{t,2}$. $d_2$ is set to $n_{1\rightarrow 0}$ and $r_2$ is set to the number of bit flips from the corresponding mirrored data point in d.

At 904, $V_{t,1}$ is set to $V_{t,2}$ and $V_{t,2}$ is set to $V_{t,1}-2\Delta$. A first read is performed at $V_{t,1}$ and a second read is performed at $V_{t,2}$. $d_3$ is set to $n_{1\rightarrow 0}$ and $r_3$ is set to the number of bit flips from the corresponding mirrored data point in d.

As before, $d_1$, $d_2$, and $d_3$ are a first, second, and third numbers of bit flips from the set d which are being considered by the process (e.g., when deciding if the optimal read threshold, or an approximation thereof, has been found). $r_1$, $r_2$, and r are first, second, and third numbers of bit flips corresponding respectively to $d_1$, $d_2$, and $d_3$, but for the conditional distribution instead of the overall distribution. An example of this is described in more detail below.

Conceptually, step 900 accounts for the special case when $d_1$ and $r_1$ related to the "center" bin (i.e., which has the axis of symmetry as its center) since there is no corresponding, mirrored data point on the other side of the axis of symmetry. See, for example, data point (10, 100) in FIG. 5 which resides on the axis of symmetry. In some other embodiments, some other values are used for $d_1$ and $r_1$ at the first iteration other than those shown in step 900.

In order to more clearly describe the technique, this example does not check (e.g., prior to steps 900 and 902) to ensure that the read thresholds (i.e., $V_{t,1}$ and $V_{t,2}$) have not reached some minimum voltage. Naturally, in some other embodiments such checks may be performed.

At 906, it is determined if $|d_1-2r_1|>|d_2-2r_2|$ and $|d_3-2r_3|>|d_2-2r_2|$. Conceptually, step 906 will cause the process to stop if the number of bit flips associated with an overall distribution is (e.g., approximately) twice the number of bit flips associated with a conditional distribution.

If the check at 906 is satisfied, then at 908 y* the optimal read threshold is output as $V_{t,1}-\Delta$. If not, it is determined at 910 if $V_{t,2}-2\Delta\leq V_{min}$. To put it another way, the check at 910 ensures that the read threshold(s) have not reached some minimum voltage. If the check at 910 is satisfied, then at 912 it is declared that y* (i.e., the optimal read threshold) cannot be found. Otherwise, $d_1$ is set to $d_2$, $r_1$ is set to $r_2$, $d_2$ is set to $d_3$, and $r_2$ is set to $r_3$ at 914 and then step 904 is repeated.

The following tables illustrate some example values to demonstrate the process of FIG. 9.

TABLE 2

Example data points from a sampled distribution generated by FIG. 8 and used in FIG. 9.

d

{(14, 10), (13, 20), (12, 35), (11, 50), (10, 100), (9, 88)}

TABLE 3

Example values for FIG 9.

| $V_{t,1}$ | $V_{t,2}$ | $d_1$ | $d_2$ | $d_3$ | $r_1$ | $r_2$ | $r_3$ | y* found? |
|---|---|---|---|---|---|---|---|---|
| — | — | 100 | — | — | 20 | — | — | — |
| 9.5 | 8.5 | 100 | 88 | — | 20 | 50 | — | — |
| 8.5 | 7.5 | 100 | 88 | 67 | 20 | 50 | 35 | No |
| 7.5 | 6.5 | 88 | 67 | 31 | 50 | 35 | 20 | Yes; y* = 8 |

Although the examples of FIGS. 8 and 9 describe using a number of bit flips (in these particular examples, the number of flips from 1 to 0, $n_{1\rightarrow 0}$), in some embodiments multiple counters are used and a difference in numbers of bit flips is used. For example, in FIG. 8, $d_1$ may be set to $n_{0\rightarrow 1}-n_{1\rightarrow 0}$ at 800, $d_2$ may be set to $n_{0\rightarrow 1}-n_{1\rightarrow 0}$ at 802, and $d_3$ may be set to $n_{0\rightarrow 1}-n_{1\rightarrow 0}$ at 804. Similarly, in FIG. 9, $d_2$ may be set to $n_{0\rightarrow 1}-n_{1\rightarrow 0}$ at 902 and $d_3$ may be set to $n_{0\rightarrow 1}-n_{1\rightarrow 0}$ at 904. Even using the same read threshold value, the same cell can be read out as 1 and 0 at different reads due to read noise. As such, in some embodiments (e.g., where the system is noisy and/or where better results are desired) multiple counters are used to track the number of bit flips from 0 to 1 and as well as from 1 to 0 as the read threshold value is moved so that a difference between the two numbers of bit flips can be taken. If needed, an absolute value may be applied to the difference.

Figure 10:
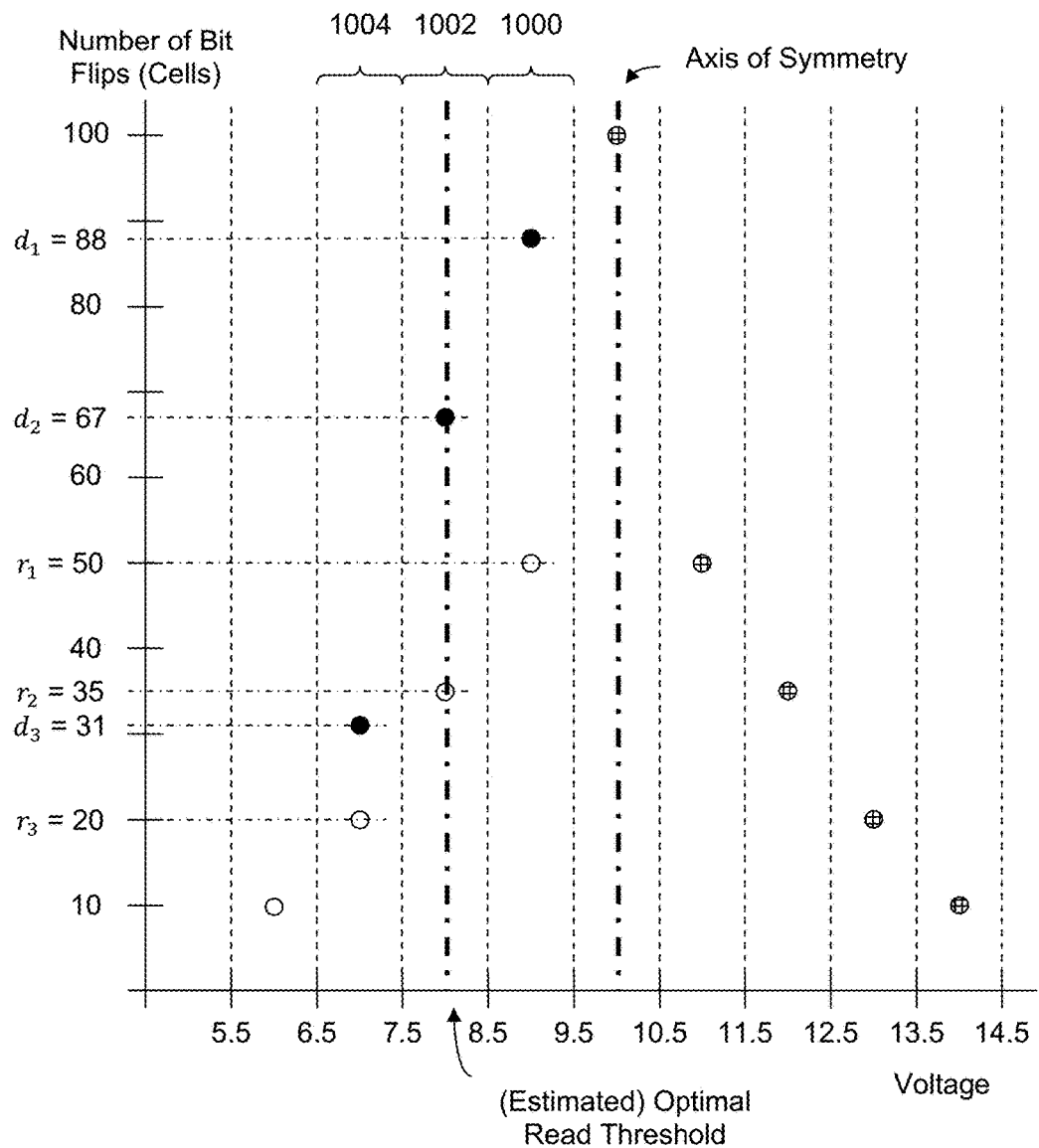
FIG. 10 is a diagram illustrating an embodiment of example values used to determine if an optimal read threshold has been found.

FIG. 10 is a diagram illustrating an embodiment of example values used to determine if an optimal read threshold has been found. This diagram corresponds to the 4$^{th}$ row in Table 3 when an optimal read threshold of y*=8 is found.

In the example shown, white dots show data points associated with a conditional distribution, generated by copying the right-side of the sampled distribution around the axis of symmetry. The black dots show the data points associated with the sampled distribution, that is, the overall distribution.

As is shown in this example, $d_1$ and $r_1$ correspond to the same bin, in this case bin 1000. Similarly, $d_2$ and $r_2$ correspond to the same bin (i.e., bin 1002) and $d_2$ and $r_2$ correspond to the same bin (i.e., bin 1004). As described above, $|d_1-2r_1|>|d_2-2r_2|$ and $|d_3-2r_3|>|d_2-2r_2|$ checks to see if the 2× relationship between the number of bit flips for the conditional distribution and the overall distribution is satisfied, and thus if the optimal read threshold has been found.

As described above, the optimal read threshold estimation techniques described herein are applicable to solid state storage systems which store any number of bits per cell. The following shows a 2-bit, MLC example.

Figure 11:
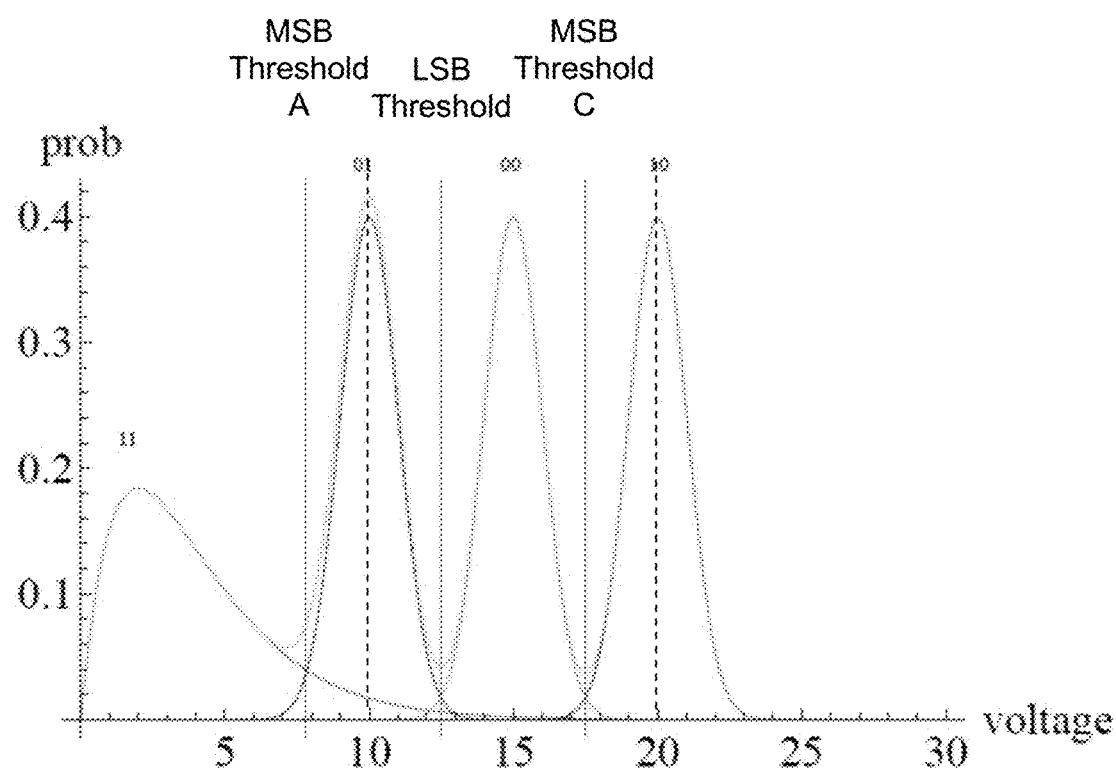
FIG. 11 is a diagram illustrating an embodiment of distributions for 2-bit, MLC solid state storage.

FIG. 11 is a diagram illustrating an embodiment of distributions for 2-bit, MLC solid state storage.

In one example, if an optimal read threshold for MSB threshold A is being estimated, then the right side of the 01 conditional distribution is sampled. The axis of symmetry for the 01 conditional distribution is then found and the sampled distribution is copied about the axis of symmetry in order to find the optimal read threshold for MSB threshold A.

Similarly, if an optimal read threshold for MSB threshold C is being estimated, then the right side of the 10 conditional distribution is sampled. The axis of symmetry for the 10 conditional distribution is then found and the sampled distribution is copied about the axis of symmetry in order to find the optimal read threshold for MSB threshold C.

Figure 12:
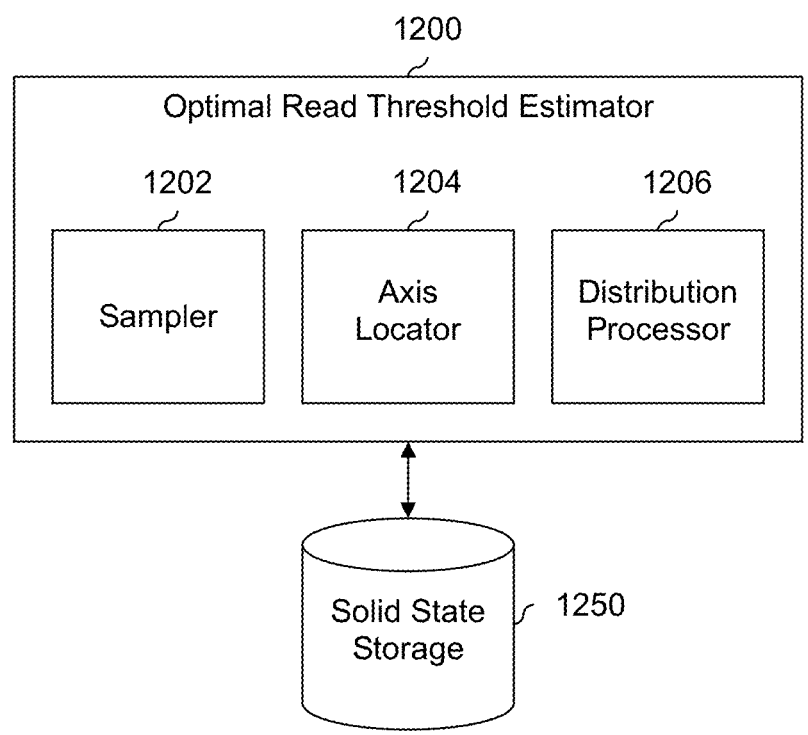
FIG. 12 is a system diagram illustrating an embodiment of an optimal read threshold estimator.

FIG. 12 is a system diagram illustrating an embodiment of an optimal read threshold estimator. Optimal read threshold estimator 1200 is one example of a system which performs the process of FIG. 3. In some embodiments, optimal read threshold estimator 1200 is implemented on a semiconductor device. In some embodiments, optimal read threshold estimator 1200 is part of a read controller. For brevity, some other elements associated with a read controller are not shown herein.

Sampler 1202 is configured to read a group of solid state storage cells in solid state storage 1250 at a plurality of read threshold values in order to obtain a sampled distribution. In various embodiments, solid storage 1250 may include SLC storage, MLC storage, TLC storage, etc.

Axis locator 1204 is configured to determine an axis of symmetry using the sampled distribution. In some embodiments, axis locator 1204 looks for a bin having a maximum (e.g., number of bit flips) in the sampled distribution and sets the axis to be the center of that bin.

Distribution process 1206 determines at least some part of a conditional distribution using the sampled distribution and the axis of symmetry. In some embodiments, a second conditional distribution is determined using the (first) conditional distribution and the sampled distribution, and the voltage at which the (first) conditional distribution and second conditional distribution intersect is output as the optimal read threshold (estimate). In some embodiments, the optimal read threshold is found without finding the second conditional distribution.

Once found, the optimal read threshold may be used to read solid state storage 1250 again. For example, a default read threshold may have returned too many bit errors and an error correction decoder (not shown) in the read processor (not shown) may not be able to corrected the read-back data because the error correction capability of the code has been exceeded. An optimal read threshold will return fewer bit errors than a default read threshold; hopefully it is within the error correction capability of the code.

Figure 13:
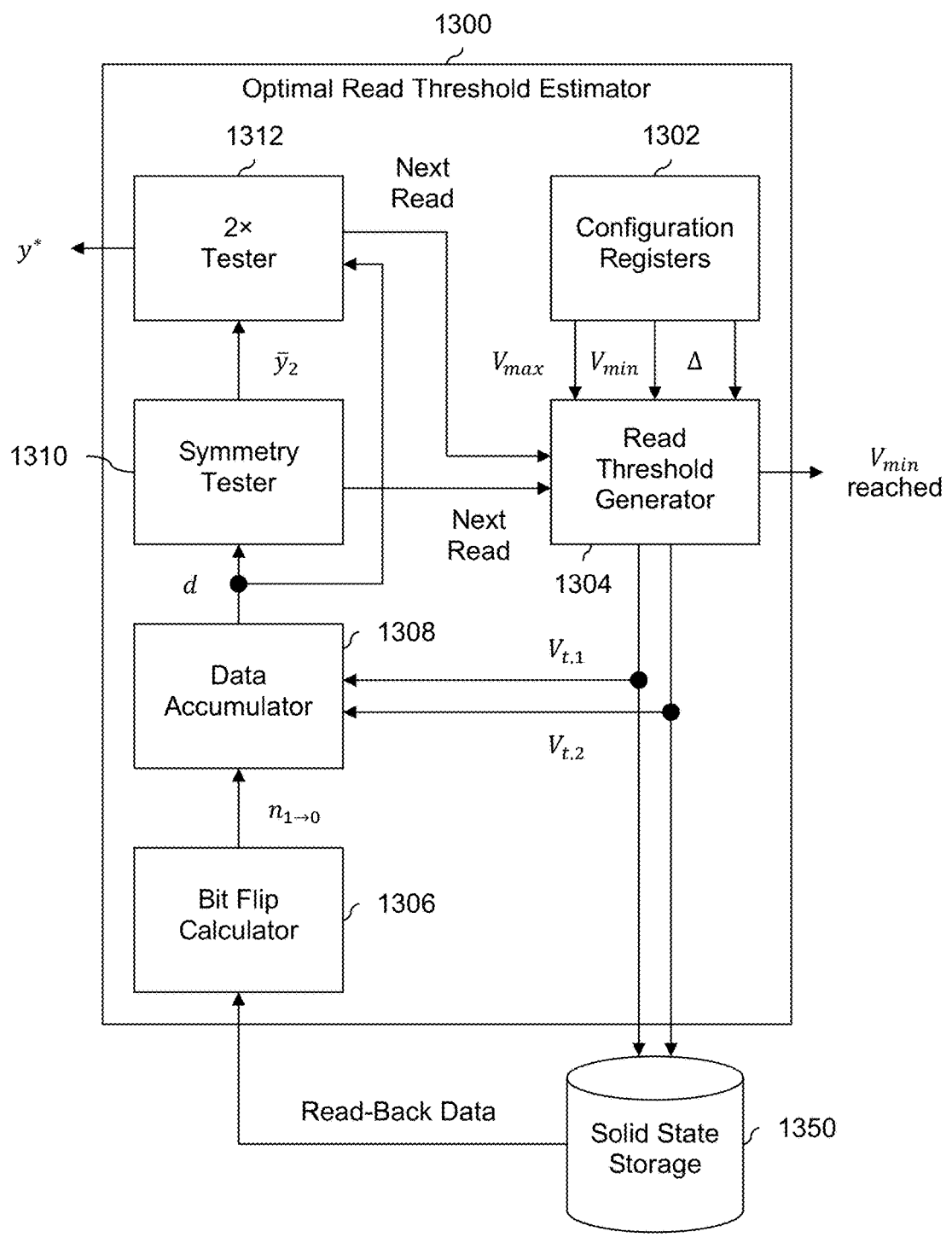
FIG. 13 is a system diagram illustrating a more detailed embodiment of an optimal read threshold estimator.

FIG. 13 is a system diagram illustrating a more detailed embodiment of an optimal read threshold estimator. In this example, configuration registers 1302 contain the programmable settings for the optimal read threshold estimation process which in this example are $V_{max}$, $V_{min}$, and $\Delta$. The settings are passed from configuration registers 1302 to read threshold generator 1304 which generates the read thresholds $V_{t,1}$ and $V_{t,2}$. If either of the read thresholds reaches $V_{min}$, then that error condition is flagged.

The read thresholds are used to read solid state storage 1350. The read-back data is passed to bit flip calculator 1306 which calculates a number of bit flips (in this example, $n_{1 \to 0}$, although $n_{0 \to 1}$ may be used) for a given bin defined by $V_{t,1}$ and $V_{t,2}$. As described above, this example may describe duplicate reads in order to more clearly described the technique; it is not necessary for these duplicate reads to actually be performed.

Data accumulator 1308 inputs the read thresholds $V_{t,1}$ and $V_{t,2}$ and the corresponding number of bit flips for each pair of $V_{t,1}$ and $V_{t,2}$. Using this information, the set of data points (i.e., d) is generated by data accumulator 1308.

Symmetry tester 1310 finds the axis of symmetry (i.e., $\bar{y}_2$) using the set of data points from data accumulator 1308. If needed, additional reads are performed by sending a next read request to read threshold generator 1304 from symmetry tester 1310.

Once the axis of symmetry is found, it is passed from symmetry tester 1310 to 2× tester 1313. Using the axis of symmetry and the set of data points, the optimal read threshold is found by looking for the voltage where the number of bit flips associated with the overall distribution is twice the number of a bit flips associated with a conditional distribution. If needed, additional reads can be requested of read threshold generator 1304 by 2× tester 1313.

In some embodiments, symmetry tester 1310 and/or 2× tester 1313 may employ techniques so that the axis of symmetry and/or the optimal read threshold are permitted to be values other than the center of a bin. For example, 2× tester 1313 may use linear interpolation to find two lines representing the overall distribution and the conditional distribution, and then find the voltage at which they intersect. This may return a more accurate result than merely outputting the center of the best bin. Similarly, symmetry tester 1310 may be implemented so that it is capable of finding an axis of symmetry which is not one of the bin centers.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
   a sampler configured to obtain a sampled distribution by sampling a group of cells in solid state storage;
   an axis locator configured to locate a maximum in the sampled distribution and determine an axis of symmetry at the located maximum; and
   a distribution processor configured to:
   generate a conditional distribution associated with the group of cells by copying and flipping a portion of the sampled distribution about the determined axis of symmetry; and
   estimate an optimal read threshold based on a difference between the sampled distribution and the conditional distribution at a read threshold voltage value.

2. The system of claim 1 further comprising the solid state storage.

3. The system of claim 2, wherein the solid state storage includes one or more of the following: single-level cell (SLC) storage, multi-level cell (MLC) storage, and tri-level cell (TLC) storage.

4. The system of claim 1, wherein the system includes a semiconductor device, including one or more of the following: an application-specific integrated circuit (ASIC) or a field-programmable gate array (FPGA).

5. The system of claim 1, wherein:
   the sampler is configured to sample, including by reading the group of solid state storage cells at a plurality of read threshold values;
   the axis locator is configured to determine the axis of symmetry, including by:
   determining, for each bin defined by the plurality of read threshold values, a number of bit flips, wherein data points associated with the sampled distribution have a first coordinate corresponding to the center of a bin and have a second coordinate corresponding to the number of bit flips for that bin;
   determining which bin has the most bit flips; and
   determining the axis of symmetry to be the center of the bin with the most bit flips; and
   the distribution processor is configured to generate the conditional distribution, including by generating the left side of the conditional distribution by flipping at least some of the data points associated with the sampled distribution about the axis of symmetry.

6. The system of claim 1, wherein the distribution processor is configured to estimate the optimal read threshold, including by:
   generating a second conditional distribution by subtracting the conditional distribution from the sampled distribution;
   determining the voltage at which the conditional distribution and the second conditional distribution intersect; and outputting the intersection voltage as the estimate of the optimal read threshold.

7. The system of claim 1, wherein the distribution processor is configured to estimate the optimal read threshold, including by:
    determining the voltage at which the sampled distribution is two times the value of the conditional distribution; and
    outputting the voltage at which the sampled distribution is two times the value of the conditional distribution as the estimate of the optimal read threshold.

8. A method, comprising:
    sampling a group of cells in solid state storage to obtain a sampled distribution;
    locating, with an axis locator, a maximum in the sampled distribution;
    determining, with the axis locator, an axis of symmetry at the located maximum;
    generating, with a distribution processor, a conditional distribution associated with the group of cells by copying and flipping a portion of the sampled distribution about the determined axis of symmetry; and
    estimating an optimal read threshold based on a difference between the sampled distribution and the conditional distribution at a read threshold voltage value.

9. The method of claim 8, wherein the solid state storage includes one or more of the following: single-level cell (SLC) storage, multi-level cell (MLC) storage, and tri-level cell (TLC) storage.

10. The method of claim 8, wherein the processor includes a semiconductor device, including one or more of the following: an application-specific integrated circuit (ASIC) or a field-programmable gate array (FPGA).

11. The method of claim 8, wherein:
    sampling includes reading the group of solid state storage cells at a plurality of read threshold values;
    determining the axis of symmetry includes:
        determining, for each bin defined by the plurality of read threshold values, a number of bit flips, wherein data points associated with the sampled distribution have a first coordinate corresponding to the center of a bin and have a second coordinate corresponding to the number of bit flips for that bin;
        determining which bin has the most bit flips; and
        determining the axis of symmetry to be the center of the bin with the most bit flips; and
    generating the conditional distribution includes generating the left side of the conditional distribution by flipping at least some of the data points associated with the sampled distribution about the axis of symmetry.

12. The method of claim 8, wherein estimating the optimal read threshold includes:
    generating a second conditional distribution by subtracting the conditional distribution from the sampled distribution;
    determining the voltage at which the conditional distribution and the second conditional distribution intersect; and
    outputting the intersection voltage as the estimate of the optimal read threshold.

13. The method of claim 8, wherein estimating the optimal read threshold includes:
    determining the voltage at which the sampled distribution is two times the value of the conditional distribution; and
    outputting the voltage at which the sampled distribution is two times the value of the conditional distribution as the estimate of the optimal read threshold.

14. A computer program product, the computer program product being embodied in a non-transitory computer readable storage medium and comprising computer instructions for:
    sampling a group of cells in solid state storage in order to obtain a sampled distribution associated with the group of cells;
    determining an axis of symmetry using the sampled distribution;
    determining of a conditional distribution associated with the group of cells based at least in part on: (1) the sampled distribution and (2) the axis of symmetry; and
    estimating an optimal read threshold using the sampled distribution and the conditional distribution;
    wherein the optimal read threshold is estimated by determining the voltage at which the sampled distribution is two times the value of the conditional distribution; and
    outputting the voltage at which the sampled distribution is two times the value of the conditional distribution as the estimate of the optimal read threshold.

15. The computer program product of claim 14, wherein the solid state storage includes one or more of the following: single-level cell (SLC) storage, multi-level cell (MLC) storage, and tri-level cell (TLC) storage.

16. The computer program product of claim 14, wherein:
    the computer instructions for sampling include computer instructions for reading the group of solid state storage cells at a plurality of read threshold values;
    the computer instructions for determining the axis of symmetry include computer instructions for:
        determining, for each bin defined by the plurality of read threshold values, a number of bit flips, wherein data points associated with the sampled distribution have a first coordinate corresponding to the center of a bin and have a second coordinate corresponding to the number of bit flips for that bin;
        determining which bin has the most bit flips; and
        setting the axis of symmetry to be the center of the bin with the most bit flips; and
    the computer instructions for determining at least some portion of the conditional distribution include computer instructions for generating the left side of the conditional distribution by flipping at least some of the data points associated with the sampled distribution about the axis of symmetry.

17. The computer program product of claim 14, wherein the computer instructions for estimating the optimal read threshold include computer instructions for:
    determining a second conditional distribution by subtracting the conditional distribution from the sampled distribution;
    determining the voltage at which the conditional distribution and the second conditional distribution intersect; and
    outputting the intersection voltage as the estimate of the optimal read threshold.

* * * * *